(12) United States Patent
Wang et al.

(10) Patent No.: US 6,461,905 B1
(45) Date of Patent: Oct. 8, 2002

(54) DUMMY GATE PROCESS TO REDUCE THE VSS RESISTANCE OF FLASH PRODUCTS

(75) Inventors: Zhigang Wang, San Jose, CA (US); Hsiao Han Thio, Sunnyvale, CA (US); Nian Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/081,246

(22) Filed: Feb. 22, 2002

(51) Int. Cl.[7] .............................................. H01L 21/338
(52) U.S. Cl. ....................... 438/183; 438/287; 438/595; 438/486; 257/412; 257/314
(58) Field of Search ................................ 438/257, 258, 438/287–289, 296, 586, 587; 257/314–317, 410–413

(56) References Cited

U.S. PATENT DOCUMENTS

| | | | |
|---|---|---|---|
| 4,753,897 A | | 6/1988 | Lund et al. |
| 4,753,987 A | * | 6/1988 | Lund et al. ................. 438/296 |
| 5,376,571 A | * | 12/1994 | Bryant et al. ............... 438/257 |
| 6,087,231 A | * | 7/2000 | Xiang et al. ................ 438/287 |
| 6,140,688 A | * | 10/2000 | Gaderner et al. ........... 257/412 |
| 6,359,304 B2 | * | 3/2002 | Nakagawa ................... 257/314 |
| 2001/0049183 A1 | | 12/2001 | Henson et al. |

OTHER PUBLICATIONS

Henson et al., Pub. No.: US 2001/0049183 A1, Pub. date: Dec. 6, 2001, Method for forming MIS transistors with a metal gate and high–k dielectric using a replacement gate process and devices obtained threrof.*

* cited by examiner

*Primary Examiner*—David Nelms
*Assistant Examiner*—Dung Anh Le
(74) *Attorney, Agent, or Firm*—Eschweiler & Associates, LLC

(57) ABSTRACT

One aspect of the invention relates to a method of manufacturing a flash memory device in which Vss lines are salicided prior to forming memory cell stacks. According to the invention, silicide is aligned to the Vss lines by a layer of temporary material, such as a silicon nitride layer, patterned to form dummy gates. A dielectric layer can be deposited and planarized with the dummy gates prior to their removal. The dielectric layer facilitates selective removal of the dummy gates and formation of memory cell stacks that are properly aligned with the Vss lines and drain regions. The dummy gate concept can be used with methods of forming low resistance Vss lines other than saliciding. One advantage of the invention is that the memory cell stacks are not exposed to high temperature processing used in forming low resistance Vss lines.

25 Claims, 5 Drawing Sheets

DUMMY GATE PROCESS TO REDUCE THE VSS RESISTANCE OF FLASH PRODUCTS

TECHNICAL FIELD OF THE INVENTION

The present invention relates generally to semiconductor device manufacturing and more particularly to methods of manufacturing flash memory devices.

BACKGROUND OF THE INVENTION

Flash memory devices are a type of EEPROM (Electrically Erasable Programmable Read-Only Memory). The term "flash" refers to the ability of the memory to be erased in blocks. As in other non-volatile memory devices, flash memory devices typically store electrical charges, representing data, in transistors having either a floating-gate or a charge-trapping dielectric. The stored charges affect the threshold voltage of the transistors. For example, in an n-channel floating-gate transistor an accumulation of electrons in the floating-gate electrode creates a high threshold voltage in the transistor. The presence or absence of the stored charge can be determined by whether current flows between a source region and a drain region of the transistor when appropriate voltages are applied to the control gate, source, and drain.

While there are myriad ways of configuring flash memory devices, in one common configuration sometimes called a NOR architecture, the drain regions of each memory cell (transistor) have a contact and are connected in rows forming bit lines in a conductive layer that runs above the memory cell stacks. The conductive layer can be, for example, a first metal layer. Source regions are typically connected by Vss lines running parallel to the word lines and leading to a common ground. The Vss lines are formed by doping the semiconductor substrate.

This configuration has proven useful in building compact, high-speed flash memory devices, however, there has been a continuous demand to further reduce the size of these devices. In further reducing the size of flash memory devices, the resistance in Vss lines has become an issue. As attempts are made to make smaller devices, it is found that the amount and depth of doping required to adequately lower resistance along Vss lines cannot be introduced without causing short channel effects. Thus, there has been an unsatisfied need for methods of further reducing the Vss resistance in flash memory devices without causing short channel effects.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

One aspect of the invention relates to a method of manufacturing a flash memory device in which Vss lines are salicided prior to forming memory cell stacks. According to the invention, silicide is aligned to the Vss lines by a layer of temporary material, such as a silicon nitride layer, patterned to form dummy gates. A dielectric layer can be deposited and planarized with the dummy gates prior to their removal. The dielectric layer facilitates selective removal of the dummy gates and formation of memory cell stacks that are properly aligned with the Vss lines and drain regions. The dummy gate concept can be used with methods of forming low resistance Vss lines other than saliciding. One advantage of the invention is that the memory cell stacks are not exposed to high temperature processing used in forming low resistance Vss lines.

Other advantages and novel features of the invention will become apparent from the following detailed description of the invention and the accompanying drawings. The detailed description of the invention and drawings provide exemplary embodiments of the invention. These exemplary embodiments are indicative of but a few of the various ways in which the principles of the invention can be employed.

DETAILED DESCRIPTION OF THE INVENTION

Figure 1:
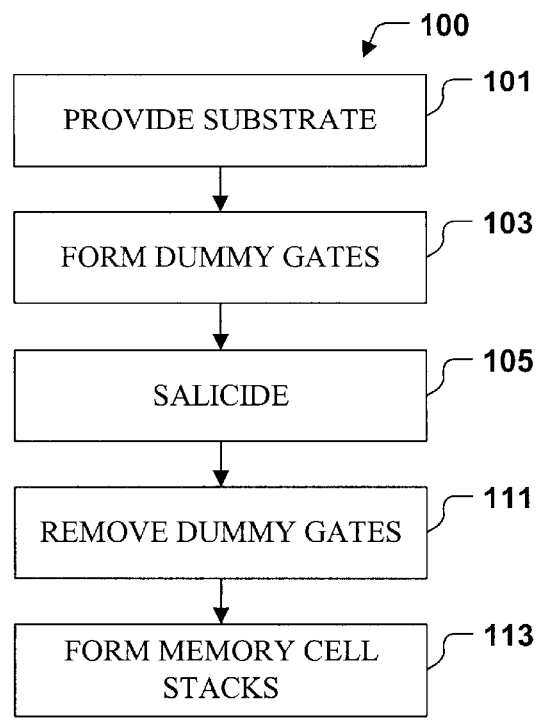
FIG. 1 is a flow chart of a process according to one aspect of the present invention.

The present invention will now be described with reference to the drawings. FIG. 1 provides a flow chart of a series of acts in a process 100 for forming a flash memory device according to one aspect of the present invention. Process 100 includes the acts of providing a substrate, act 101, forming dummy gates over the substrate, act 103, saliciding Vss lines on the substrate with the dummy gates providing alignment for the silicide, act 105, removing the dummy gates, act 111, and forming memory cell stacks for memory cells having source regions comprising and connected by the Vss lines, act 113.

Act 101 provides a substrate comprising a semiconductor. The semiconductor is typically silicon. Other examples of semiconductors include GaAs and InP. In addition to a semiconductor, the substrate may include various elements therein and/or layers thereon. These can include metal layers, barrier layers, dielectric layers, device structures, active elements and passive elements including silicon gates, word lines, source regions, drain regions, bit lines, bases emitters, collectors, conductive lines, conductive vias, etc.

In a typical process, isolation regions are formed on and/or within the semiconductor substrate. Isolation regions comprise a dielectric, generally an oxide, and can function to isolate drain regions from adjacent drain regions and memory cells from adjacent memory cells in the finished flash memory device. Isolation regions are formed generally by local oxidation of silicon (LOCOS) or shallow trench isolation (STI).

Act 103, forming the dummy gates, according to one exemplary aspect of the present invention, generally takes place after isolation regions are formed. Dummy gates include a temporary material. The temporary material can have any suitable composition, although it is preferably stable under processing at temperatures in excess of 1000° C. and preferably it can be removed with selectivity to silicon oxide features. An exemplary temporary material is silicon nitride. The silicon nitride can be silicon-rich or nitrogen-rich, for example. The silicon nitride can include constituents other than silicon and nitrogen, such as oxygen, provided that the material retains much of the high temperature stability and etch susceptibility of a pure silicon nitride.

Figure 2:
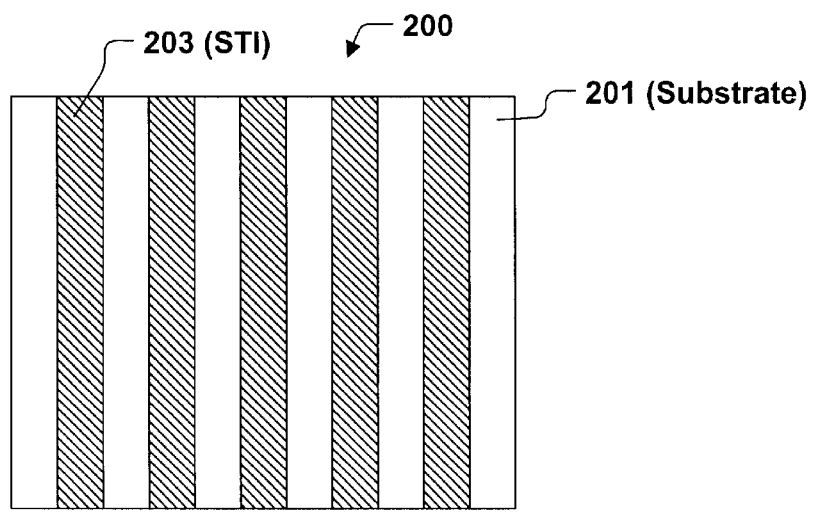
FIG. 2 is a top or plan view illustration showing the configuration of shallow trench isolation regions in a flash memory device.
Figure 3:
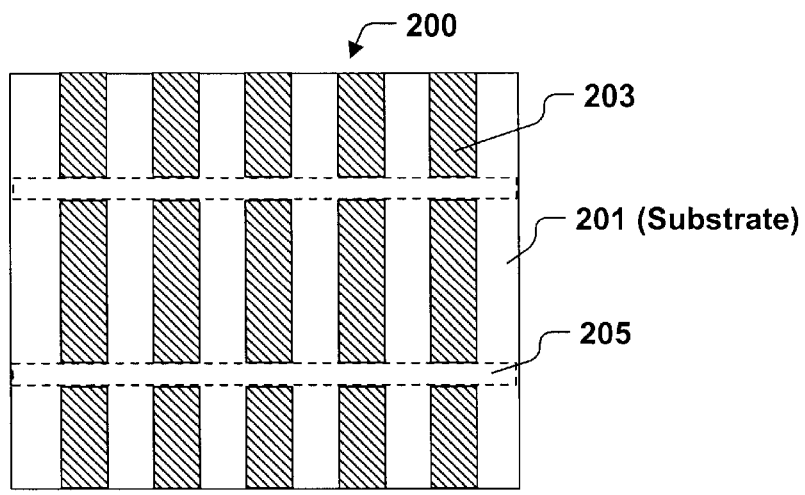
FIG. 3 is a top or plan view illustration of the device of FIG. 2 after removal of dielectric in locations for Vss lines.
Figure 4:
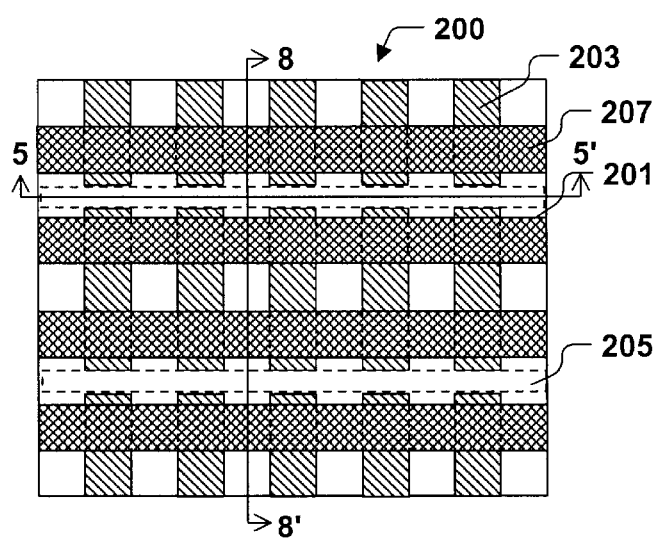
FIG. 4 is a top or plan view illustration of the device of FIG. 3 after formation of dummy gates.

The temporary material covers channel regions for memory cells in the core region of the memory device, but does not cover source regions for the memory cells. The temporary material is generally spin-coated or deposited to form a contiguous layer and then patterned lithographically. A pad oxide layer is generally formed on the substrate prior to depositing the temporary material. The pad oxide acts as an etch stop for when the temporary material is removed.

Where STI is used to form elongated trenches, the temporary material is generally patterned to form columns that run perpendicular to those trenches. FIG. 2 illustrates a device 200 including a substrate 201 in which is formed shallow trench isolation regions 203. For this type of device, a mask and etch can be used to remove dielectric from the isolation regions 203 in locations where Vss lines are desired. FIG. 3 illustrates the device 200 after such etching. In FIG. 3, a Vss line location 205 is indicated with broken lines. FIG. 4 illustrates the device 200 after forming dummy gates 207 with act 103 of FIG. 1. Alternatively, the dummy gates 207 can be formed before the isolation regions 203 are etched.

Figure 5:
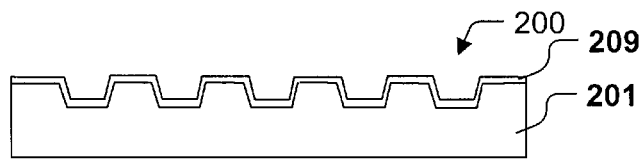
FIG. 5 is an illustration showing a cross-section of the device of FIG. 4 along the line 5–5' after doping to form Vss lines.

Preferably, the dummy gates serve as a mask for doping source regions, Vss lines, and drain regions. The Vss lines need only be lightly or moderately doped as subsequent processing greatly reduces Vss line resistivity. Light doping is advantageous in that it avoids short channel effects in very small scale devices. Preferably, the doping provides no more than about $1\times10^{17}$ atoms/cm$^3$, more preferably no more than about $2\times10^{16}$ atoms/cm$^3$, and still more preferably no more than about $6\times10^{15}$ atoms/cm$^3$. Preferably the doping is carried out by ion implantation at an energy level no greater than about 60 keV, more preferably no greater than about 50 keV, and still more preferably no greater than about 40 keV in order to form shallow source/drain regions. FIG. 5 provides an illustration along line 5–5' of FIG. 4 after doping to form Vss lines 209. FIG. 5 shows that the Vss line 209 descend into trenches where oxide has been removed.

After the Vss lines line are doped, they can be salicided, which is act 105 of FIG. 1. Saliciding refers to a self-aligned silicide process. In the process 100, the dummy gates at 103 function to align the silicide with respect to the source and drain regions for the memory cells. Other structures, such as isolation regions, can also function to align the silicide.

A typical salicide process involves providing a blanket coating of a metal. Rapid thermal annealing (RTA) is then carried out under conditions wherein the metal reacts with exposed silicon to form a metal silicide. After RTA, unreacted metal, for example that which overlies dummy gates, is removed. An additional RTA can be employed to obtain the silicide in a desired, low resistivity phase.

Any suitable metal can be employed, including metals of Group IV-A, V-A, and VIII. Specific examples include Pt, Ru, Ti, Ni, and Co. Preferably, the metal is one, such as Pt or Ru, that forms a silicide that is stable at temperatures up to about 700° C. or higher, more preferably up to about 900° C. or higher, and still more preferably up to about 1000° C. or higher. The metal can be coated by any suitable method, including, for example, evaporation, sputtering, or CVD.

RTA induces chemical reactions and phase changes while avoiding prolonged heating of the substrate. Prolonged heating could cause undue diffusion of the metal or dopants. Appropriate temperatures and heating times depend on the type of silicide. Un-reacted metal is removed by washing with an acid solution or another suitable technique. Where two RTA steps are employed, one to form a silicide and a second to cause a phase change in the silicide, the unreacted metal is optionally removed between the two annealing steps.

Figure 6:
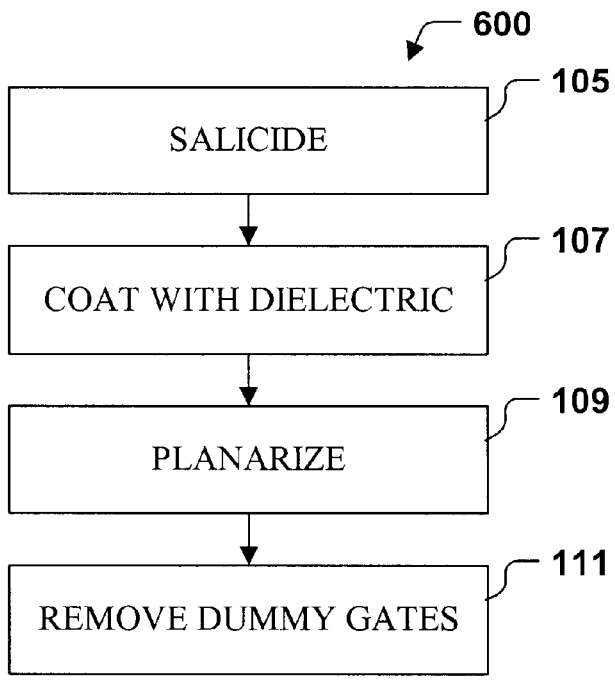
FIG. 6 is a flow chart of a process according to another aspect of the present invention.

After saliciding at act 105, but prior to removing the temporary material at act 111, a dielectric can be formed in the negative image of the dummy gate pattern as illustrated by process 600 in FIG. 6. In process 600, this is accomplished by coating with a dielectric, act 107, and planarizing, act 109. The dielectric can facilitate removal of the dummy gate material by protecting silicon and silicide features during the removal process. The dielectric can also facilitate the alignment of memory cells with the source and drain regions after the temporary material has been removed. Typically, the dielectric is an oxide such as silicon oxide. The dielectric can be planarized with the dummy gate material by any suitable process, although chemical mechanical polishing (CMP) is generally employed.

Act 111 is removing the temporary material by a suitable process. For example, where the temporary material is a silicon nitride and silicon features are protected by oxide, the temporary material can be removed by wet etching or dry etching.

Figure 7:
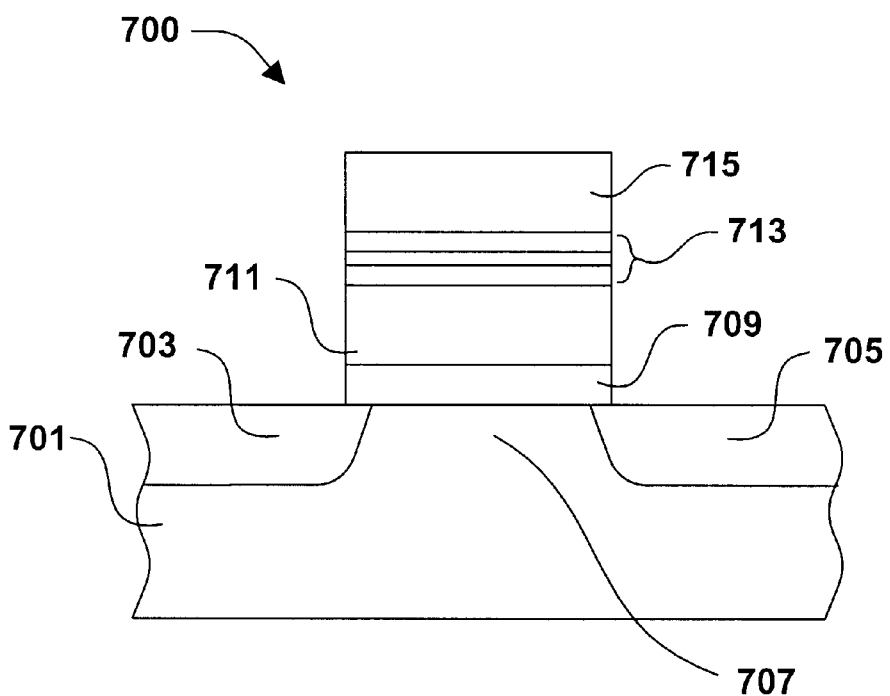
FIG. 7 is a cross-sectional illustration of a floating gate memory cell.

Returning to process 100, after removal of the temporary material, memory cell stacks can be formed with act 113. The memory cell stacks can be of any suitable type, including for example, floating gate or SONOS types. FIG. 7 is a schematic illustration of an exemplary floating gate memory cell 700. Memory cell 700 includes substrate 701 in which are formed source region 703 and drain region 705, which together define a channel region 707 therebetween. The channel region 707 has a doping-type opposite that of the source region 703 and the drain region 705. Formed over the channel region 707 are, in order, a tunnel oxide 709, floating gate 711, inter-poly dielectric 713, and polysilicon control gate 715. The inter-poly dielectric 713 is frequently a multi-layer dielectric, such as an oxide-nitride-oxide ONO layer.

In principle, the tunnel oxide 709 can be a pad oxide layer from a dummy gate stack. However, it is preferable to remove the pad oxide layer, clean the silicon surface, and provide a new tunnel oxide layer to ensure a high quality tunnel oxide. The tunnel oxide can include silicon dioxide. However, for very compact devices, it is often desirable to use a material that has a higher permittivity than silicon dioxide and can be provided in greater thickness than an equivalent silicon dioxide layer while giving the same capacitance. Such materials are referred to as high-k dielectrics. The term tunnel oxide is inclusive of high-k dielectrics, although not all high-k dielectrics are oxides.

High-k dielectrics include silicates, aluminates, titanates, and metal oxides Examples of silicate high-k dielectrics include silicates of Ta, Al, Ti, Zr, Y, La and Hf, including Zr and Hf doped silicon oxides and silicon oxynitrides. Examples of aluminates include transition metal aluminates, such as compounds of Zr and Hf. Examples of titanate high-k dielectrics include $BaTiO_3$, $SrTiO_3$, and $PdZrTiO_3$. Examples of metal oxide high-k dielectrics include oxides of refractory metals, such as Zr and Hf, and oxides of Lanthanide series metals, such as La, Lu, Eu, Pr, Nd, Gd, and Dy. Additional examples of metal oxide high-k dielectrics include $Al_2O_3$, $TiO_2$, $Ta_2O_5$, $Nb_2O_5$ and $Y_2O_3$.

Processing steps subsequent to act 105, saliciding, may involve temperatures between about 600° C. and about 1000° C. For example, the tunnel oxide may be grown at a temperature of about 900° C. The floating gate 711 and the polysilicon control gate 715 may be formed by depositing amorphous silicon and annealing to form polysilicon. These annealing steps can be carried out at temperatures in the range of about 800 to about 1000° C., for example. Therefore, silicides that are stable in these temperature ranges are preferred.

Higher temperatures are generally employed to form the silicides. These higher temperatures could cause dopants to diffuse into and reduce the reliability of tunnel oxide layers in floating memory cell stacks. An advantage provided by the invention is that saliciding is carried out before memory cell stack formation, whereby high temperatures can be employed in forming Vss lines without risking damage to sensitive structures in the memory cells. Preferably, all processing after act 105 is carried out at temperatures less than about 1000° C., more preferably at temperatures less than about 950° C., and still more preferably at temperatures less than about 900° C.

Similar considerations apply when SONOS memory cell stacks are employed. SONOS memory cell stacks include a charge trapping dielectric and a control gate. The charge trapping dielectric can be any dielectric layer or layers suitable for electron trapping. For example, charge trapping dielectrics include an ONO tri-layer dielectric, an oxide/nitride bi-layer dielectric, a nitride/oxide bi-layer dielectric, an oxide/tantalum oxide bi-layer dielectric ($SiO_2/Ta_2O_5$), an oxide/tantalum oxide/oxide tri-layer dielectric ($SiO_2/Ta_2O_5/SiO_2$), an oxide/strontium titanate bi-layer dielectric ($SiO_2/SrTiO_3$), an oxide/barium strontium titanate bi-layer dielectric ($SiO_2/BaSrTiO_2$), an oxide/strontium titanate/oxide tri-layer dielectric ($SiO_2/SrTiO_3/SiO_2$), an oxide/strontium titanate/barium strontium titanate tri-layer dielectric ($SiO_2/SrTiO_3/BaSrTiO_2$), and the like (in each case, the first layer mentioned is the bottom layer while the last layer mentioned is the top layer). Although the term SONOS is suggestive of an ONO layer, the term SONOS encompasses nonvolatile memory devices containing other types of charge trapping dielectrics as indicted by the foregoing examples. A process of the invention can be employed to salicide Vss lines in a SONOS memory device while avoiding high temperature processing steps that could undesirably affect the charge-trapping dielectric.

Other processes within the scope of the invention involve replacing act 105, saliciding, with another process for forming low resistivity Vss lines. All these processes for forming low resistivity Vss lines generally involve high temperatures that are preferably avoided after memory cell stack formation. For example, low resistivity Vss lines can be obtained by epitaxial growth of a doped semiconductor layer. As a specific example, the semiconductor can be a silicon-germanium alloy. An epitaxial layer will generally have a high level of doping, preferably about $1 \times 10^{20}$ atoms/cm$^3$ or greater, more preferably about $5 \times 10^{20}$ atoms/cm$^3$ or greater. In principle, ion implantation can also be employed to form low resistivity Vss lines, although the degree of ion implantation required to form low resistivity Vss lines is generally not practical for very small scale devices in view of short channel effects which are caused by heavy doping. Regardless of the process employed, the resistivity of the Vss lines is preferably reduced to about 300 ohms or less along a length of the Vss line, more preferably to about 100 ohms or less, and still more preferably to about 30 ohms or less.

Figure 8:
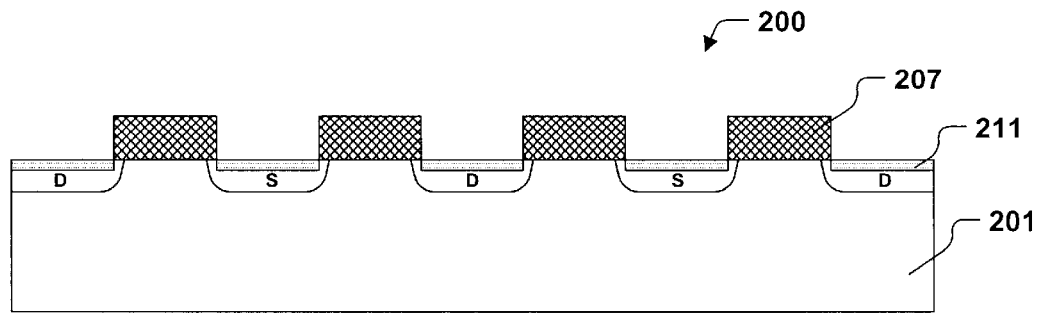
FIG. 8 is a cross-sectional view along the line 8–8' of FIG. 4 after saliciding.

FIGS. 8 to 12 illustrate an exemplary process according to the present invention applied to the device 200. FIGS. 8 to 12 provide cross-sectional views along the line 8–8' of FIG. 4. FIG. 8 illustrates the cross-sectional view after saliciding. Salicided areas 211 have formed over source and drain regions in the substrate 201 between the dummy gates 207.

Figure 9:
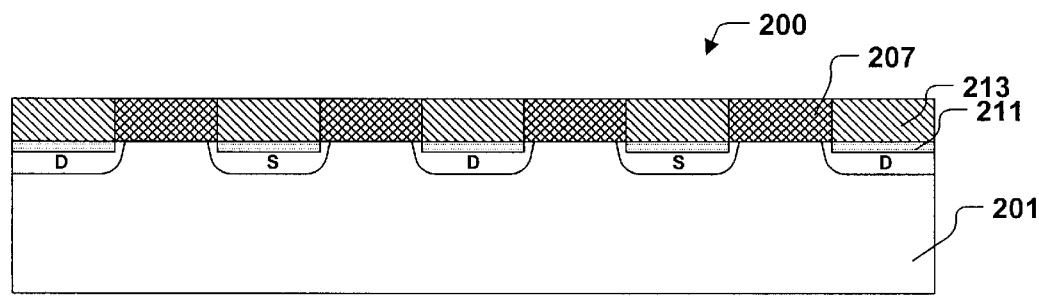
FIG. 9 is the cross-sectional view after depositing an oxide and planarizing.

FIG. 9 provides an illustration after the further actions of depositing a blanket coating of oxide 213 followed by CMP to co-planarize the dummy gates 207 and the oxide 213. As shown in FIG. 9, the oxide 213 fills the gaps between the dummy gates 207 and covers the salicided areas 211.

Figure 10:
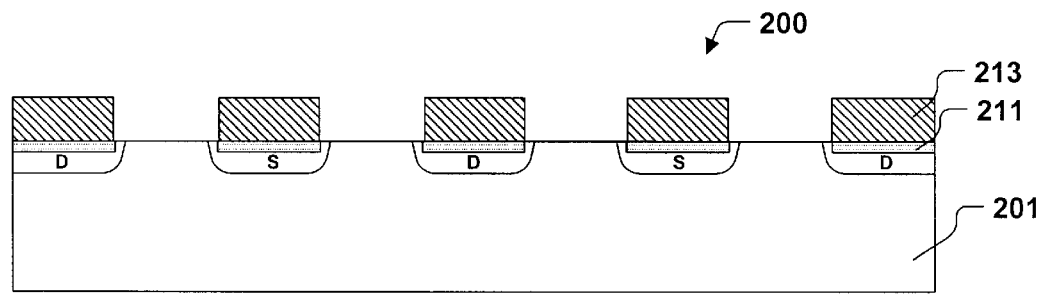
FIG. 10 is the cross-sectional view after removing the dummy gates.

FIG. 10 illustrates the device 200 after removal of the dummy gates 207 via, for example, dry or wet etching. The oxide 213 remains behind and can be used as a mask in forming a tunnel oxide for a memory cell stack.

Figure 11:
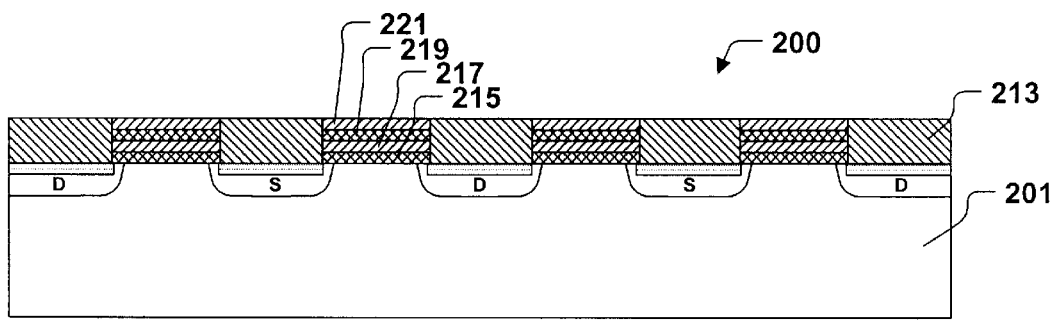
FIG. 11 is the cross-sectional view after forming memory cell stacks.

As illustrated in FIG. 11, memory cell stacks are formed in the spaces formerly occupied by the dummy gates 207. The memory cells stacks include a tunnel oxide 215, a first polysilicon or floating gate layer 217, an interlevel dielectric 219, and a second polysilicon or control gate layer 221. Forming the memory cell stacks generally includes at least two mask and etch operations. The first mask and etch operation isolates the floating gates 217. The second mask and etch separates the control gates 221 and forms them into word lines that run parallel to the Vss lines.

Figure 12:
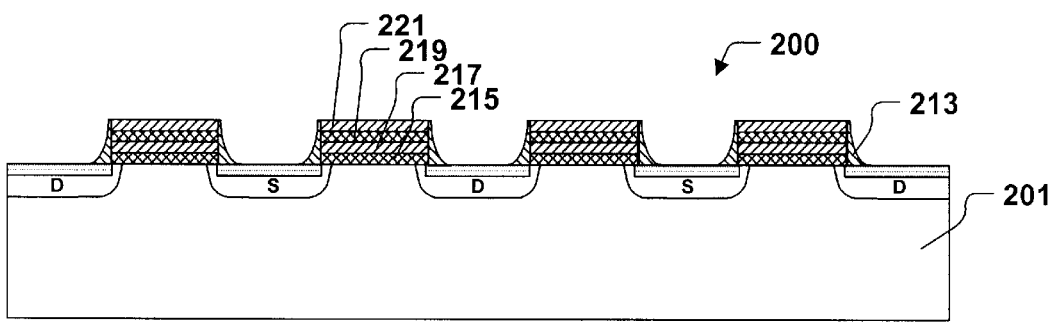
FIG. 12 is the cross-sectional view after etching the oxide.

It may be desirable to etch away much of the oxide 213 prior to forming metal interconnect layers. In FIG. 12, most of the oxide 213 has been removed by dry etching.

Although the invention has been shown and described with respect to certain embodiments, alterations and modifications providing equivalent structures and acts are likely to occur to those of ordinary skill in the art upon the reading and understanding this specification and the associated drawings. Such alterations and modifications are intended to fall within the scope of the present invention, unless expressly stated to the contrary. Components described in functional terms have structure and involve acts, unless otherwise indicated, corresponding to any of the devices and methods known to those of ordinary skill in the art to perform those functions, even though not equivalent to any of the structures and acts that perform those function in the exemplary embodiments of the invention. In addition, while a particular feature of the invention may have been disclosed with respect to only one of several embodiments, such feature may be combined with one or more other features of the other embodiments as may be desired or advantageous for a given or particular application.

The present invention is not limited by the illustrated ordering of the acts as some acts may occur in different orders and/or concurrently with other acts or events. In addition, all illustrated acts or events may not be required to implement a methodology in accordance with the present invention. In the following claims, the ordering of acts is only a limitation to the extent required explicitly or dictated by internal references within the claims.

What is claimed is:

1. A method of manufacturing a flash memory device, comprising:
   providing a substrate comprising a semiconductor;
   forming over a surface of the semiconductor substrate a patterned layer of temporary material having gaps in which a portion of the semiconductor is exposed;
   saliciding the exposed portion of the semiconductor;
   removing the patterned layer; and
   forming memory cell stacks in locations previously occupied by the patterned layer.

2. The method of claim 1, wherein the temporary material comprises silicon nitride.

3. The method of claim 2, wherein the silicon nitride is formed over a pad oxide layer.

4. The method of claim 1, wherein the exposed portion of the semiconductor includes locations for Vss lines for the flash memory device.

5. The method of claim 1, further comprising, prior to removing the patterned layer, filling the gaps with a second material.

6. The method of clam 5, wherein the second material is a dielectric.

7. The method of claim 6, further comprising chemical mechanical polishing to remove the dielectric outside the gaps.

8. The method of claim 1, wherein the memory cell stacks are of a floating gate type.

9. The method of claim 1, further comprising forming isolation regions prior to forming the patterned layer.

10. The method of claim 1, wherein processing steps necessary to complete the formation of the flash memory device after saliciding are carried out at temperatures less than or equal to about 950° C.

11. The method of claim 1, wherein saliciding forms a silicide that is stable at temperatures up to about 900° C. or higher.

12. The method of claim 1, wherein saliciding forms a ruthenium or platinum silicide.

13. A method of manufacturing a flash memory device, comprising:
   providing a substrate comprising a semiconductor;
   forming over a surface of the semiconductor substrate a patterned layer of temporary material having gaps in which a portion of the semiconductor is exposed;
   forming isolation regions prior to forming the patterned layer, wherein the isolation regions comprise an oxide and a portion of the oxide is selectively removed along a Vss line location prior to a saliciding;
   saliciding the exposed portion of the semiconductor;
   removing the patterned layer; and
   forming memory cell stacks in locations previously occupied by the patterned layer.

14. A method of manufacturing a flash memory device, comprising:
   providing a substrate comprising a semiconductor;
   forming over a surface of the semiconductor substrate a patterned layer of temporary material having gaps in which a portion of the semiconductor is exposed, wherein the exposed portion of the semiconductor includes locations for Vss lines for the flash memory device;
   saliciding the exposed portion of the semiconductor, wherein the saliciding includes doping the Vss line locations, and wherein the Vss lines are doped to a dopant concentration no greater than about $1\times10^{17}$ atoms/cm$^3$;
   removing the patterned layer; and
   forming memory cell stacks in locations previously occupied by the patterned layer.

15. A method of manufacturing a flash memory device, comprising:
   providing a substrate comprising a semiconductor;
   forming over a surface of the semiconductor substrate a patterned layer of temporary material having gaps in which a portion of the semiconductor is exposed, wherein the exposed portion of the semiconductor includes locations for Vss lines for the flash memory device;
   saliciding the exposed portion of the semiconductor, wherein the saliciding includes doping the Vss line locations, and wherein the Vss lines are doped with an energy no greater than about 60 keV;
   removing the patterned layer; and
   forming memory cell stacks in locations previously occupied by the patterned layer.

16. A method of manufacturing a flash memory device, comprising:
   providing a substrate comprising a semiconductor;
   forming over a surface of the semiconductor substrate a patterned layer of temporary material having gaps in which a portion of the semiconductor is exposed, wherein the exposed portion of the semiconductor includes locations for Vss lines for the flash memory device;
   saliciding the exposed portion of the semiconductor, wherein the saliciding includes doping the Vss line locations, and wherein the Vss lines have a resistance no greater than about 300 ohms along a length thereof in the finished device;
   removing the patterned layer; and
   forming memory cell stacks in locations previously occupied by the patterned layer.

17. A method of manufacturing a flash memory device, comprising:
   providing a substrate comprising a semiconductor;
   forming over a surface of the semiconductor substrate a patterned layer of temporary material having gaps in which a portion of the semiconductor is exposed;
   using the patterned layer as a mask, forming low resistance electrical pathways;
   removing the patterned layer; and
   forming memory cell stacks in locations previously occupied by the patterned layer.

18. A method of manufacturing a flash memory device, comprising:
   providing a substrate comprising a semiconductor;
   forming over a surface of the semiconductor substrate a patterned layer of temporary material having gaps in which a portion of the semiconductor is exposed;
   using the patterned layer as a mask, forming low resistance electrical pathways, wherein the low resistance electrical pathways comprise Vss lines with a resistance no greater than about 300 ohms;
   removing the patterned layer; and forming memory cell stacks in locations previously occupied by the patterned layer.

19. A method of manufacturing a flash memory device, comprising:

forming in a semiconductor substrate a plurality of generally parallel isolation regions extending in a first direction of a core portion of the flash memory device, wherein the isolation regions serve to isolate bit lines of the flash memory device;

patterning in the semiconductor substrate one or more trenches extending in a second direction of the core portion, wherein the second direction is generally perpendicular to the first direction, and wherein the one or more trenches are in locations corresponding to one or more Vss lines to which source terminals of subsequently formed flash memory cells are electrically coupled;

forming on a surface of the semiconductor substrate a plurality of dummy gates extending in the second direction, thereby defining regions between the dummy gates as exposed portions of the semiconductor substrate;

performing a source/drain implantation into the exposed portions of the semiconductor substrate, thereby defining source regions along the trenches and drain regions elsewhere in the core region of the semiconductor substrate;

saliciding the source and drain regions in the exposed portions of the semiconductor substrate, wherein the salicided source regions are electrically connected to one another along each of the one or more trenches to form Vss lines;

filling the regions between the dummy gates a second, electrically insulating material;

removing the dummy gates; and forming transistor gate stacks in locations previously occupied by the dummy gates.

20. The method of claim 19, wherein filling the regions between the dummy gates with a second, electrically insulating material comprises:

depositing an oxide over the semiconductor substrate, wherein the oxide fills the regions between the dummy gates and covers the dummy gates; and performing a chemical mechanical polish of the oxide to remove the oxide covering the dummy gates, thereby leaving oxide between the dummy gates.

21. The method of claim 19, wherein the dummy gates comprise a silicon nitride.

22. The method of claim 19, wherein performing a source/drain implantation comprises implanting an n-type dopant to form source regions and drain regions having a dopant concentration of about $1 \times 10^{17}$ atoms/cm$^3$ or less.

23. The method of claim 19, wherein the source regions and drain regions have a dopant concentration of about $6 \times 10^{15}$ atoms/cm$^3$ or less.

24. The method of claim 19, wherein the source/drain implantation is performed at an energy level of about 60 keV or less.

25. The method of claim 24, wherein the source/drain implantation is performed at an energy level of about 40 keV or less.

* * * * *

UNITED STATES PATENT AND TRADEMARK OFFICE
CERTIFICATE OF CORRECTION

PATENT NO.     : 6,461,905 B1
DATED          : October 8, 2002
INVENTOR(S)    : Zhigang Wang, Hsiao Han Thio and Nian Yang It is certified that error appears in the above-identified patent and that said Letters Patent is hereby corrected as shown below:

<u>Column 10,</u>
Line 22, please replace the numeral "19" with the numeral -- 22 --.

Signed and Sealed this

Seventh Day of January, 2003

JAMES E. ROGAN
*Director of the United States Patent and Trademark Office*